(12) United States Patent
Reiss et al.

(10) Patent No.: US 9,923,129 B2
(45) Date of Patent: Mar. 20, 2018

(54) METHOD FOR PRODUCING AN LED MODULE AND LED MODULE

(71) Applicant: OSRAM GmbH, Munich (DE)

(72) Inventors: Martin Reiss, Sinzing (DE); Simon Schwalenberg, Donaustauf (DE)

(73) Assignee: Osram GmbH, Munich (DE)

(*) Notice: Subject to any disclaimer, the term of this patent is extended or adjusted under 35 U.S.C. 154(b) by 158 days.

(21) Appl. No.: 14/421,153

(22) PCT Filed: Aug. 7, 2013

(86) PCT No.: PCT/EP2013/066534
§ 371 (c)(1),
(2) Date: Feb. 12, 2015

(87) PCT Pub. No.: WO2014/032924
PCT Pub. Date: Mar. 6, 2014

(65) Prior Publication Data
US 2016/0380166 A1    Dec. 29, 2016

(30) Foreign Application Priority Data
Aug. 31, 2012   (DE) .................. 10 2012 215 514

(51) Int. Cl.
*H01L 33/58* (2010.01)
*H01L 33/62* (2010.01)
(Continued)

(52) U.S. Cl.
CPC .......... *H01L 33/58* (2013.01); *H01L 25/0753* (2013.01); *H01L 33/486* (2013.01);
(Continued)

(58) Field of Classification Search
None
See application file for complete search history.

(56) References Cited

U.S. PATENT DOCUMENTS

| | | | |
|---|---|---|---|
| 4,179,619 A | 12/1979 | Cook | |
| 7,517,728 B2 * | 4/2009 | Leung | H01L 33/507 257/E21.499 |

(Continued)

FOREIGN PATENT DOCUMENTS

| | | |
|---|---|---|
| CN | 1937270 A | 3/2007 |
| CN | 1947266 A | 4/2007 |

(Continued)

OTHER PUBLICATIONS

Chinese Office Action based on applicaiton No. 201380040987.3 (9 pages + 13 pages English translation) (for reference purpose only).

(Continued)

*Primary Examiner* — Hoang-Quan Ho
(74) *Attorney, Agent, or Firm* — Viering, Jentschura & Partner mbB (57) ABSTRACT

Various embodiments may relate to a method for producing an LED module, including providing a housing implemented as a hollow body, having an opening on a light exit side of the LED module, wherein the housing has a base side, arranged opposite to the light exit side, arranging a circuit board having one LED on the base side of the housing, pouring in one first base layer made of a curable material in a non-cured state through the opening into the housing, and pouring in a scattering layer made of a curable material in a non-cured state through the opening into the housing. The scattering layer is poured in onto the first base layer. The first base layer is not cured during the pouring in of the scattering layer, and after the pouring in of the scattering layer, the one first base layer and the scattering layer are cured.

19 Claims, 3 Drawing Sheets

(51) Int. Cl.
*H01L 33/48* (2010.01)
*H01L 33/54* (2010.01)
*H01L 25/075* (2006.01)
*H01L 25/00* (2006.01)
*H01L 33/56* (2010.01)

(52) U.S. Cl.
CPC .............. *H01L 33/54* (2013.01); *H01L 33/62* (2013.01); *H01L 25/50* (2013.01); *H01L 33/56* (2013.01); *H01L 2924/0002* (2013.01); *H01L 2933/005* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 9,735,198 B2* | 8/2017 | Joo | H01L 33/505 |
| 2003/0214233 A1* | 11/2003 | Takahashi | H01L 33/508 |
| | | | 313/512 |
| 2004/0089898 A1 | 5/2004 | Ruhnau et al. | |
| 2005/0073840 A1* | 4/2005 | Chou | F21K 9/00 |
| | | | 362/238 |
| 2005/0093005 A1 | 5/2005 | Ruhnau et al. | |
| 2005/0218531 A1 | 10/2005 | Ruhnau et al. | |
| 2005/0224829 A1* | 10/2005 | Negley | H01L 33/52 |
| | | | 257/99 |
| 2006/0255353 A1 | 11/2006 | Taskar et al. | |
| 2007/0064751 A1 | 3/2007 | Tokunaga | |
| 2007/0287208 A1* | 12/2007 | Thompson | C08L 83/04 |
| | | | 438/26 |
| 2009/0026482 A1 | 1/2009 | Ruhnau et al. | |
| 2009/0145647 A1* | 6/2009 | Tanaka | H01L 33/62 |
| | | | 174/260 |
| 2009/0152582 A1 | 6/2009 | Chang et al. | |
| 2010/0230694 A1 | 9/2010 | Arndt et al. | |
| 2010/0277932 A1 | 11/2010 | Chen et al. | |
| 2010/0327307 A1 | 12/2010 | Ruhnau et al. | |
| 2011/0057201 A1* | 3/2011 | Tasch | H01L 33/20 |
| | | | 257/76 |
| 2011/0069256 A1 | 3/2011 | Ohkubo | |
| 2011/0180822 A1 | 7/2011 | Ruhnau et al. | |
| 2012/0161621 A1 | 6/2012 | Sato | |
| 2012/0181559 A1 | 7/2012 | Park et al. | |
| 2012/0220059 A1* | 8/2012 | Ito | H01L 33/52 |
| | | | 438/26 |
| 2013/0207142 A1* | 8/2013 | Reiherzer | H01L 33/507 |
| | | | 257/98 |
| 2013/0256711 A1* | 10/2013 | Joo | H01L 33/486 |
| | | | 257/88 |

FOREIGN PATENT DOCUMENTS

| | | |
|---|---|---|
| CN | 101443924 A | 5/2009 |
| CN | 101459163 A | 9/2009 |
| CN | 101675535 A | 3/2010 |
| DE | 2851951 A1 | 6/1979 |
| DE | 10229067 A1 | 1/2004 |
| DE | 10 2007 015 474 A1 | 10/2008 |
| WO | 2007-137006 A2 | 11/2007 |
| WO | 2007137006 A2 | 11/2007 |

OTHER PUBLICATIONS

Chinese Search Report based on application No. 2013800409873 (3 pages) (for reference prupose only).
Office Action received for German Patent Application No. 10 2012 215 514.7, dated Aug. 8, 2013, 6 pages.
International Search Report in the PCT application PCT/EP2013/066534 (5 pages), dated Oct. 16, 2013.
Chinese 2nd Office Action based on application No. 201380040987.3 (12 pages and 11 pages of English translation) dated Dec. 22, 2016.

* cited by examiner

METHOD FOR PRODUCING AN LED MODULE AND LED MODULE

RELATED APPLICATIONS

The present application is a national stage entry according to 35 U.S.C. § 371 of PCT application No.: PCT/EP2013/066534 filed on Aug. 7, 2013, which claims priority from German application No.: 10 2012 215 514.7 filed on Aug. 31, 2012, and is incorporated herein by reference in its entirety.

TECHNICAL FIELD

Various embodiments relate to a method for producing an LED module and an LED module.

BACKGROUND

Linear LED modules are known from the related art, in which LEDs are arranged linearly in a row in a housing having a light exit side. To be able to no longer perceive the LEDs as individual light sources and to implement the greatest possible homogeneity of the emitted light with regard to the brightness and the light color, a light-scattering matrix material can be introduced into the housing, by the light mixing and scattering effects of which more homogeneous emission of the light is enabled. To achieve satisfactory light mixing of the individual LEDs, the thickness of the matrix material, i.e., the distance from a light exit side of the LED up to the light exit side of the LED module, must be correspondingly large, in particular, this thickness must be greater, the greater the distance of the LEDs from one another is. It is disadvantageous in this case that if a volume-scattering means is used, such as the scattering matrix material, for homogenizing the light, large light losses occur, which reduces the light decoupling efficiency. This effect is greater the thicker the scattering matrix material is. To reduce the light losses due to the thick scattering matrix material, firstly a transparent layer can be provided as the matrix material, on the surface of which a thinner scattering layer is applied. Less light loss due to the scattering layer is then registered, but other problems occur in the case of this embodiment. In particular, phase boundaries between the layers result due to this two-layer or multilayer structure, inter alia, caused by adhesive layers located between the layers for fixing the individual layers on one another, on which the light is reflected.

Furthermore, the production methods for such LED modules are very complex and costly, since surface pre-treatments, for example, targeted plasma surface pre-treatments, are necessary for applying the individual layers to one another, in order to achieve sufficient adhesion of the scattering layer on the transparent layer. In particular, it must be ensured by methods having very complex production that delaminations do not form between the layers, which result in additional boundary layers in the beam path of the LED, which can be easily recognized in a linear product as clearly perceptible local light color differences.

Nonetheless, local delaminations occur between the layers in the course of time due to stresses, such as differing thermal expansion of the layers, which in turn result in increased reflection of the light and cause color variations along the linear module. Therefore, heretofore satisfactory decoupling efficiency and homogeneity of the emitted light has not been able to be achieved even by this multilayer arrangement.

Figure 1:
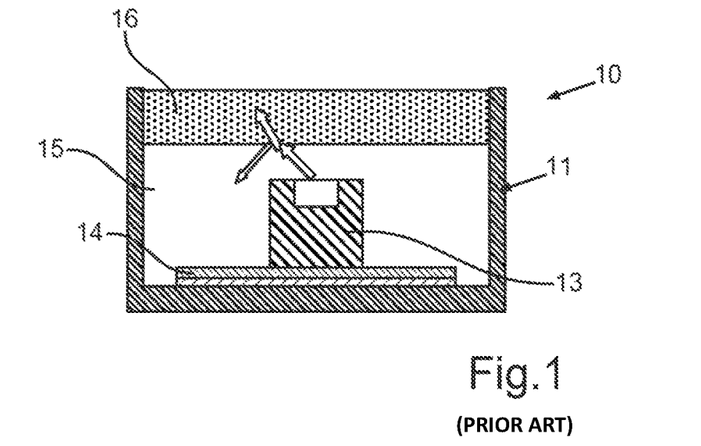
FIG. 1 shows a schematic illustration of a multilayer LED module according to the related art.

FIG. 1 schematically shows a multilayer LED module 10 according to the related art in cross section to illustrate these problems. The LED module 10 includes a housing 11 in this case, in particular implemented as a U-profile, and an LED 13, which is arranged on a base side 12 of the housing 11, on a circuit board 14. Furthermore, a transparent matrix material 15 is introduced into the housing 11, on which a scattering layer 16 is arranged. The arrows shown are to schematically illustrate the light emitted from the LED 13 in this case. This LED module 10 has the disadvantage that strong reflection of the light emitted from the LED 13 occurs due to phase boundaries between the layers 15 and 16. These phase boundaries are caused, inter alia, by different refraction properties of the transparent layer 15 and the scattering layer 16, and also by adhesive layers located in between. Furthermore, local delaminations contribute to this due to stresses of the LED module 10, which also strengthen this effect of strong reflection and additionally cause color variations along the LED module 10.

SUMMARY

Various embodiments provide an LED module and a method for producing an LED module, by means of which a high level of homogeneity of the light emitted from the LED module may be provided, without having to accept losses in the decoupling efficiency.

In the method according to the disclosure for producing an LED module, firstly a housing is provided, which is implemented as a hollow body, which has an opening on a light exit side of the LED module. Furthermore, the housing has a base side, which is arranged opposite to the light exit side. Furthermore, a circuit board having at least one LED is arranged on the base side of the housing. At least one first base layer made of a curable material is poured in a non-cured state through the opening into the housing and furthermore a scattering layer, also made of a curable material, is poured in a non-cured state through the opening into the housing.

According to various embodiments, the scattering layer is poured in onto the first base layer, wherein the first base layer is not cured during the pouring in of the scattering layer, and after pouring in of the scattering layer, the at least one first base layer and the scattering layer are cured.

The first base layer is to be made of a transparent material in this case. The distance of the scattering layer to the LED can be set in a well-defined manner by this transparent layer. In particular, the layer thickness and therefore the distance of the LED to the scattering layer can be set in a manner adapted to the distances of possibly multiple linearly arranged LEDs of the LED module, so that a particularly high level of homogeneity of the brightness of the emitted light of the LED module may be implemented, particularly along the LED module, i.e., along the linear arrangement of the LEDs. By pouring the scattering layer onto the not-yet-cured base layer, particularly good adhesion of the scattering layer on the base layer is implemented. The risk of delaminations occurring in the course of time is therefore low, whereby the decoupling efficiency and also the homogeneity of the emitted light with respect to the light color can be increased in a particularly advantageous manner by means of the method. A further advantage is that by way of this method, an adhesive layer is not required between the scattering layer and the base layer. Phase boundaries caused by adhesive layers can thus be avoided, whereby the reflections at boundary layers between the layers can also be reduced and therefore the decoupling efficiency can also be increased. In addition, this method does not require complex and costly surface treatments of the base layer, to ensure sufficient adhesion of the layers to one another. This method for producing an LED module is therefore also substantially simpler and more cost-effective.

According to various embodiments, during the pouring in of the first base layer, a sufficient amount of curable material is poured in that a surface of the poured-in base layer assumes a curvature pre-definable by a filling quantity.

For example, the base layer can be poured in nearly up to the upper edge of the housing. This upper edge is defined in this case as an upper edge of a delimitation side of the housing, wherein the delimitation side forms the lateral surfaces of the housing. In particular, this delimitation side is arranged on the base side of the housing and extends from the base side up to the light exit side of the LED module, wherein the base side and the delimitation side define the hollow body having the opening, as which the housing is implemented. If the filling quantity thus reaches this upper edge of the housing, an outwardly bulging, convex shape of the surface of the first base layer is formed. The scattering layer subsequently poured in onto the first base layer is therefore also curved or bulges outward. In particular, a concave-convex shape of the scattering layer can thus be achieved. The material of the first base layer can also be poured in a smaller quantity into the housing, in particular only up to a specific height. In the event of suitable wetting of the first base layer toward the delimitation side of the housing, a downwardly bulging, in particular concave surface of the first base layer forms. During the subsequent pouring in of the scattering layer onto the first base layer, a biconvex shape of the scattering layer can thus be formed, for example.

Thus, by way of the filling quantity of the first base layer, on the one hand, a pre-definable curvature of the surface thereof can be achieved and accordingly also a corresponding shaping of the subsequently poured-in scattering layer. This curvature of the surface also has effects on the homogeneity of the emitted light, in particular, a high level of homogeneity in a direction perpendicular to the longitudinal extension direction of the LED module can thus be achieved in a particularly advantageous manner. The longitudinal extension direction is to be understood in this case to mean that in the case of an arrangement of multiple LEDs on the base side of the housing in a linear manner or essentially in a line, the direction of this linear arrangement is defined as the longitudinal extension direction. A particularly high level of homogeneity of the emitted light can thus also be achieved in the case of an arrangement of only one LED in the housing, in particular in a direction from a central emission axis of the LED outward, i.e., in the case of the most central possible arrangement of the LED on the base side of the housing, toward the delimitation side of the housing. In this case, reflections can also be reduced by suitable implementation of the curvature of the surface of the first base layer. For example, light emitted from the LED is incident nearly perpendicularly everywhere on a surface of the base layer which is curved outward, whereby the decoupling efficiency can also be increased.

An embodiment of the method according to the disclosure, which includes the two aspects of the method according to the disclosure, is particularly preferred. An increase in the homogeneity of the emitted light of the LED module in every direction with respect to brightness and light color may thus be achieved, the decoupling efficiency may be increased, and simultaneously the costs and the expenditure of the production method may be reduced.

In various embodiments, during the provision of the housing, a notch is introduced at least regionally into a delimitation side of the housing, this notch extending at a distance to the base side of the housing. In this case, the delimitation side is arranged on the base side and extends from the base side up to the light exit side of the LED module, wherein the base side and the delimitation side define the cavity having the opening.

By way of this notch, the height of the wetting of the first base layer in relation to the delimitation side of the housing can be set in a particularly advantageous manner. During the pouring in of the first base layer, the delimitation side is wetted by the first base layer at most only up to the notch in this case. Furthermore, as already mentioned, a curved, in particular concavely curved surface of the first base layer forms. Because the height of the wetting in relation to the delimitation side is predefined by the notch, the curvature of the surface can also be determined by the poured-in quantity of the material of the first base layer. In this case, preferably enough material is poured into the housing that the surface of the first base layer is located below the notch, wherein the delimitation side is wetted up to the notch. The more material is poured in, the less strongly the surface is curved. Thus, the radius of curvature of the curved surface of the first base layer can also be set by the filling quantity of the material in a particularly advantageous manner. A homogenization of the emitted light can thus be achieved, which is optimally adapted to the geometry of the LED module, i.e., for example, height, width, arrangement of the LED, emission angle of the LED, etc.

In various embodiments, a material is used for the scattering layer which includes a base material having scattering particles, wherein the base material has the same properties as those of the first base layer, so that a phase boundary does not form during the curing of the first base layer and the scattering layer.

In particular, in this case the base material of the scattering layer is to be the same material as that of the first base layer, wherein this base material of the scattering layer is additionally provided with scattering particles. The first base layer and the scattering material thus have the same material properties, for example, the same index of refraction, the same coefficients of thermal expansion, etc. The selection of the same material or base material has a variety of advantages. On the one hand, reflections on the scattering layer can again be reduced by the same index of refraction and, on the other hand, mechanical stresses, for example, due to thermal expansion, can also be prevented by the same coefficient of thermal expansion. This in turn prevents the occurrence of delaminations, which in turn results in fewer losses due to reflections, increases the decoupling efficiency, and increases the homogeneity of the emitted light. This embodiment is particularly advantageous in combination with a method according to the first aspect of the disclosure. By pouring in the scattering layer onto the not-yet-cured first base layer and curing these layers simultaneously, these layers fuse with one another to a certain extent. Because these layers also are still made of the same material or base material, no phase boundary arises between the layers. The first base layer and the scattering layer more or less form a unit or a uniform layer, wherein scattering particles are located in a defined region of this uniform layer. This region having the scattering particles can be defined as the scattering layer. There are thus no Fresnel back reflections of the light emitted from the LED, which are absorbed on the component surfaces, for example, the circuit board, whereby the decoupling efficiency can be optimized. Total internal reflection also does not occur, which back-reflects the more yellow-colored light of white LEDs at high emission angles and would thus result in a blue color shift of the LED module.

In various embodiments, the LED has a light exit side, which defines an upper edge of the LED. The at least one first base layer is poured in such that a surface of the first base layer opposite to the base side of the housing after the pouring in has a distance to the light exit side of the LED module which is less than a distance of the upper edge of the LED from the light exit side of the LED module.

Thus, by pouring in the first base layer up to a specific height, the distance of the scattering layer to the LED can be set in a well-defined manner. In particular, the layer thickness of the first base layer and therefore the distance of the LED to the scattering layer can be set in a manner adapted to the distances of multiple linearly arranged LEDs of the LED module. In the case of a greater distance of multiple linearly arranged LEDs, the layer thickness of the first base layer is accordingly preferably to be selected as greater. A particularly high level of homogeneity of the brightness of the emitted light of the LED module, particularly along the LED module, i.e., along the linear arrangement of the LEDs, may thus be implemented.

In various embodiments, before the pouring in of the first base layer, a second base layer is poured in through the opening of the housing into the housing, wherein the first base layer is poured in onto the second base layer.

This second base layer can have a white pigmentation in this case. By way of this additional layer, for example, the appearance of the LED module and its emission behavior can be designed according to specific demands or optical requirements. In particular, the white pigmentation also ensures good reflectivity of back-reflected light, whereby the decoupling efficiency can also be additionally increased.

In this case, the second base layer is preferably poured in at most up to the upper edge of the LED. After the curing of this layer, the first base layer can then be poured in and cured together with the subsequently poured in scattering layer.

The LED module according to the disclosure includes a housing, which is implemented as a hollow body, which has an opening on a light exit side of the LED module. The housing has a base side, which is arranged opposite to the light exit side, and a delimitation side, which is arranged on the base side and which extends from the base side up to the light exit side of the LED module. The base side and the delimitation side define in this case the hollow body having the opening. The LED module furthermore includes a circuit board, which is arranged on the base side of the housing, and an LED, which is arranged on the circuit board, and which has a light exit side which defines an upper edge of the LED. Furthermore, the LED module includes a layer sequence arranged in the housing having layers in a sequence in a direction from the base side of the housing to the light exit side of the LED module. The layer sequence is arranged in this case so it encloses the LED and contacts the delimitation surface of the housing and has at least one first base layer and one scattering layer, wherein the first base layer and the scattering layer are formed from one material in each case and the scattering layer has a distance to the LED. The scattering layer is arranged on the first base layer, wherein the first base layer is arranged at least between the scattering layer and the upper edge of the LED.

In an LED module according to various embodiments, the material of the scattering layer includes a base material having scattering particles, wherein the base material is the same material as that of the first base layer.

The first base layer and the scattering layer thus have the same material properties, for example, the same index of refraction, the same coefficients of thermal expansion, etc. The selection of the same material or base material also has the above-described advantages here, that, on the one hand, reflections on the scattering layer are reduced by the same index of refraction and, on the other hand, mechanical stresses, for example, the thermal expansion, can also be avoided by way of the same coefficients of thermal expansion. This in turn prevents the occurrence of delimitations, which in turn results in fewer losses due to reflections, increases the decoupling efficiency, and increases the homogeneity of the emitted light. Thus, the problems occurring in the related art, which result from material incompatibilities, can thus be remedied in a particularly advantageous manner. A polymer material, for example, silicone or polyurethane, is particularly suitable as a material in this case. The scattering material still has scattering particles in this case, which are preferably adapted to the LED type.

In an LED module according to various embodiments, the scattering layer has a thickness which is not spatially constant.

It can thus be made possible that the path which the light emitted from the LED covers through the scattering layer is equal in all emission directions. The light mixing and scattering effect of the scattering layer on the light emitted from the LED is thus also the same in all emission directions, whereby a particularly high level of homogeneity of the light emitted by the LED module can be achieved.

A particularly preferred embodiment of the invention includes the two aspects according to the invention of the LED module having the above-described advantages.

Furthermore, it is preferable that the thickness of the scattering layer in a region having a smaller distance to the delimitation side of the housing is less than the thickness of the scattering layer in a region having a greater distance to the delimitation surface of the housing. In the case of a linear arrangement of multiple LEDs in a longitudinal extension direction of the housing, the distance to the delimitation side is to be understood as in the cross-sectional plane perpendicular to the longitudinal extension direction of the housing. It can thus be made possible that the path which the light emitted from the LED covers through the scattering layer is equal in all emission directions, if the LED is arranged in a central region of the base side of the housing with respect to the delimitation side of the housing, in particular again to be understood in a cross section perpendicular to a longitudinal extension direction of the housing. As described above, this results in a particularly high level of homogeneity of the light emitted from the LED module.

In various embodiments, the at least one first base layer and the scattering layer have a shared intermediate surface, which has a curvature. Furthermore, the curvature is predefinable by a quantity of material of the first base layer and/or an embodiment of the delimitation surface of the housing. For example, the delimitation surface can have a notch. By way of this notch, together with the filling quantity of the material of the first base layer, the curvature of the surface of the base layer, i.e., the intermediate surface between the first base layer and the scattering layer can be predefined, as already described above. The mentioned intermediate surface can also be understood in this case as a virtual intermediate surface, in particular in the case of an LED module which is produced by means of the method according to the first aspect of the disclosure, since the first base layer and the scattering layer, which is more or less fused therewith, are more to be considered as two regions of a single layer, wherein one of these regions has scattering particles.

Furthermore, the intermediate surface can be concave or convex. In addition, it is advantageous if the scattering layer also has a surface, which has a curvature, on the light exit side of the LED module. Shapes of the scattering layer, such as a biconvex shape or a concave-convex shape, may thus also be implemented, which have the advantageous property that the scattering layer is thicker in the middle, i.e., in a region having a greater distance to the delimitation side of the housing, than at the edge, i.e., in a region having a lesser distance to the delimitation side of the housing.

Furthermore, the advantages, features, and embodiment variants which were mentioned for the method according to the disclosure apply similarly, if applicable, to the LED module according to the disclosure and its embodiment variants. In particular, the mentioned embodiment variants and individual features may be combined with one another as desired.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 2:
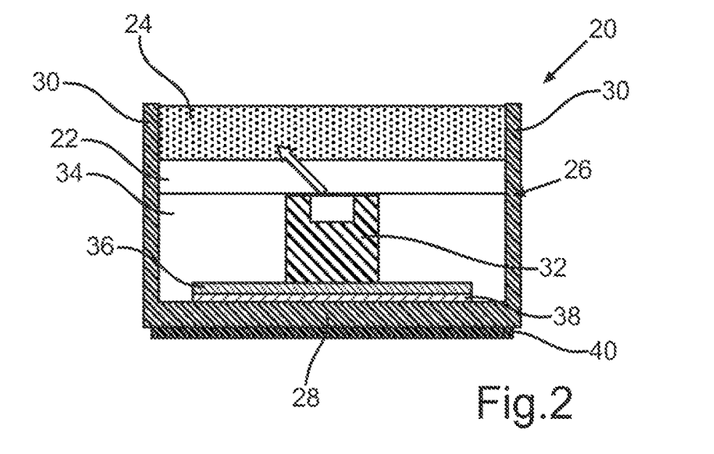
FIG. 2 shows a schematic illustration of an LED module having a transparent base layer and a scattering layer according to various embodiments.

FIG. 2 shows a schematic illustration of an LED module 20 having a first transparent base layer 22 and a scattering layer 24 according to various embodiments. The LED module 20 includes in this case a housing 26 having a base side 28 and a delimitation side 30, which delimits the LED module 20 to the outside. The delimitation side 30 may include multiple regions in this case, for example, a front region, a rear region, and two lateral regions, depending on the implementation of the housing 26. The housing 26 can also be implemented as round, for example, rotationally-symmetrical, or trough-shaped. An implementation of the housing 26 is preferred in this case which, as shown, has a U-profile in a cross section and extends perpendicularly to the illustrated cross-sectional plane in a longitudinal extension direction. Multiple LEDs 32 can be arranged linearly in this longitudinal extension direction, in particular on a circuit board 36, which is arranged on the base side 28 of the housing 26. The LED module 20 furthermore has a first base layer 22, which is formed from a transparent matrix material. A scattering layer 24, which is preferably formed from the same matrix material having scattering particles, is arranged on this first base layer 22. Depending on the optical requirements and demands on the appearance, the LED module 20 can also have a second base layer 34, which is implemented as a white-pigmented layer and extends up to the LED upper edge.

The LED strip, i.e., the LEDs 32 arranged on a flexible circuit board 36, for example, can be permanently fixed by a polymer adhesive 38 on the base side 28 of the housing 26. The housing 26 can be manufactured in this case from a polymer material, such as silicone, polyurethane, polycarbonate, or metal, such as aluminum, stainless steel, etc. In this case, a substrate, for example, polyimide or FR4, can be used for the LED strip, on which LEDs 32 are installed together with other electrical components. Furthermore, the LED strip may include a solder stop lacquer, for example, based on acrylate or epoxy resin. The polymer adhesive 38 can furthermore be based on silicone, PU, or epoxy resin. The adhesive 38 is dispensed in a defined layer thickness into the U-profile, subsequently the LED strip is cured without bubbles.

Depending on the optical requirements, a transparent or white pigmented filler layer is introduced. In the case of the pigmented layer, i.e., in particular the second base layer 34, it preferably ends at the LED upper edge and, after the curing, for example, thermally, a transparent layer having defined height, i.e., the first base layer 22, is once again applied to define the distance to the scattering layer 24. In the case in which the filler layer is completely transparent, it can rise above the LED upper edge and simultaneously define the distance of the scattering layer 24 to the LED upper edge. A mixture made of polymer matrix material, which is in particular the same material as the transparent layer 22, having scattering particles adapted to the LED type, is dispensed on the not-yet-cured transparent layer 22 made of polymer matrix material, for example, silicone or PU. Subsequently, it is cured, for example, thermally. To fasten the LED module 20 on an underlay, for example, a double-sided adhesive tape 40 can be laminated onto the rear side of the U-profile.

The schematically shown light beam of the LED 32 is to illustrate that Fresnel back reflections occurring at the interface between the first base layer 22 and the scattering layer 24 can be prevented. In particular, this is enabled in that the scattering layer 24 is dispensed on to the not-yet-cured first base layer 22, after which joint curing of the layers 22 and 24 takes place. If the scattering layer 24 and the first base layer 22 are additionally made of the same material, after the curing of these layers 22 and 24, there is additionally no phase boundary between these layers 22 and 24, at which the light is reflected. The decoupling efficiency of the LED module 20 can thus be increased in a particularly cost-effective and simply produced way, and particularly homogeneous light distribution with respect to brightness and light color can be enabled simultaneously. In addition, the scattering and transparent layers 22 and 24 can also represent an IP protection.

Figure 4:
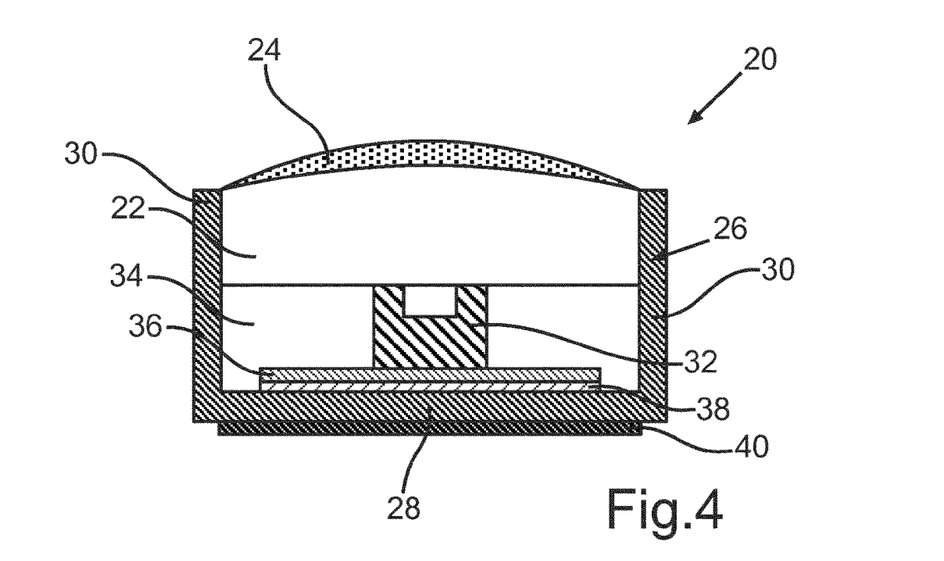
FIG. 4 shows a schematic illustration of an LED module having a transparent base layer and a scattering layer having a concave-convex shape according to various embodiments.

FIG. 4 shows a schematic illustration of an LED module 20, in which the scattering layer 24 is implemented as a biconvex shape, according to various embodiments. For this purpose, the delimitation side 30 of the housing 26 can have a notch 42. This notch 42 causes the transparent layer 22 to form a meniscus. The curvature of the meniscus is dependent in this case on the filling quantity of the transparent matrix material introduced into the housing 26. The geometric shape of the scattering layer 24 is also caused by the notch 42 of the U-profile and the introduced material quantity. The previously dispensed transparent layer 22, which forms a meniscus, is filled up later by the scattering layer 24, which forms a biconvex shape thereon. In this case, the polymer material should have good wetting on the U-profile and additionally should have a high viscosity, preferably greater than 10,000 mPa*s, and a high surface tension, preferably greater than 50 mN/m. This is to say that the material should be nearly stable, but at the same time should still flow easily and form a smooth surface in this case. During the curing, the shape can only still change slightly, i.e., the viscosity can only be dependent on the temperature to a minor extent. This behavior is displayed, for example, by silicones, other polymers must be adjusted accordingly by means of the average chain length.

The shaping of the notch 42 is not decisive in this case, in particular, the notch 42 can have any arbitrary shape. Due to the surface tension and the good wetting of the material on the U-profile, the material rises up the delimitation side 30 during the pouring in and thus forms a meniscus. The rising height on the delimitation side 30 of the housing 26 can be delimited by the notch 42. If little material is poured in, the meniscus is thus strongly curved, if more material is poured in, the meniscus is thus less strongly curved.

Figure 5:
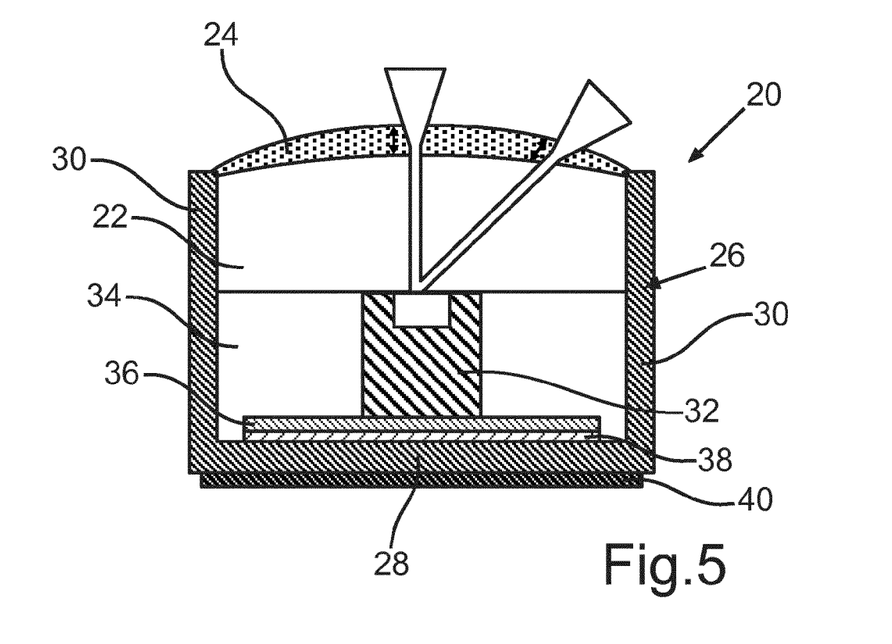
FIG. 5 shows a schematic illustration of the light path of an LED of an LED module having a transparent base layer and a scattering layer having a concave-convex shape according to various embodiments.

FIG. 5 shows a schematic illustration of an LED module 20 having a scattering layer 24, which has a concave-convex shape, according to various embodiments. In this case, the filling quantity of the transparent layer 22 is set so that a convex surface results. In particular, the housing 26 can be filled with material up to the light exit side of the LED module 20, i.e., up to the upper edge of the delimitation side 30 of the housing 26, so that a concave shape forms. The scattering layer 24 can then be dispensed on to the not-yet-cured transparent layer 22. The polymer material should also have good wetting on the U-profile in this case and additionally should have a high viscosity, preferably greater than 10,000 mPa*s, and a high surface tension, preferably greater than 50 mN/m. This means that the material should also be nearly stable here, but should still flow easily at the same time, so that the shape only still slightly changes during the curing, i.e., the viscosity can only be dependent on the temperature to a minor extent.

Figure 3:
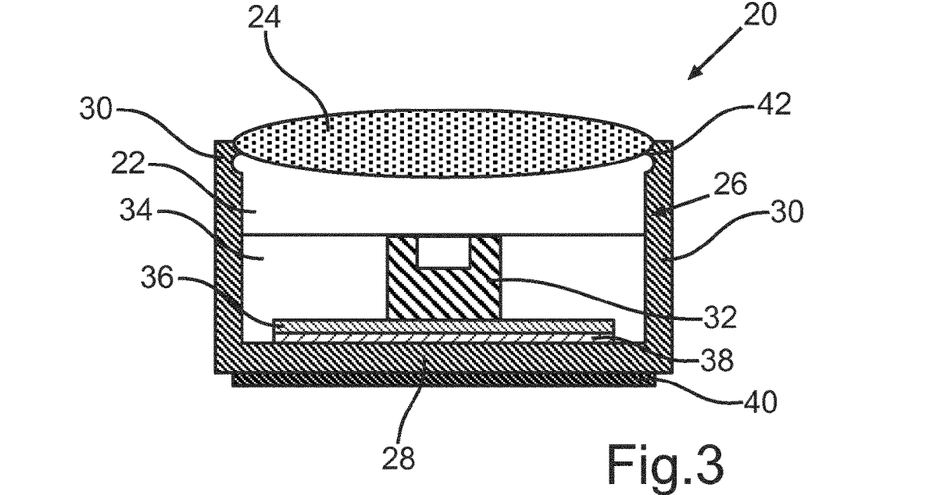
FIG. 3 shows a schematic illustration of an LED module having a transparent base layer and a scattering layer having a biconvex shape according to various embodiments.

FIG. 5 shows a schematic illustration of the light path of an LED 32 of an LED module 20 having a transparent first base layer 22 and a scattering layer 24 having a concave-convex shape according to various embodiments. By way of the implementation of the scattering layer 24 having a concave-convex shape as shown in FIG. 4, the macroscopic path length in the scattering layer 24 can be made approximately equal for various LED emission angles. Therefore, it can be implemented that light emitted from the LED 32 in different emission angles experiences the same light mixing and scattering effect due to the scattering layer 24, whereby a particularly homogeneous module appearance is made possible from various viewing directions. This also applies similarly to the embodiment variant of the LED module 20 having a biconvex scattering layer 24 shown in FIG. 3. In particular, this applies to all embodiments having LEDs 32 arranged centrally on the base side 28 of the housing 26 and an implementation of a scattering layer 24, the thickness of which decreases from the middle of the emission side of the LED module 20 toward the delimitation side 30 of the housing 26.

Overall, a method for producing an LED module and an LED module are thus provided, by which the decoupling efficiency and the homogeneity of the emitted light are increased in a particularly advantageous manner. Because the scattering layer is applied in not-yet-cured form to the not-yet-cured transparent layer, the polymer matrix material of the scattering layer is the same as that of the transparent layer, and the required scattering layer shape on the underside results from the shape of the transparent layer, the curvature of which can be predefined by the filling quantity and the embodiment of the U-profile, a variety of advantages are achieved. No phase boundary forms, whereby an index of refraction jump between scattering layer and transparent layer is avoided, a uniform layer made of polymer matrix material is obtained, since the liquid polymer matrix material having the scattering particles is applied to the liquid, not-yet-cured polymer matrix material. The scattering particles are therefore located at a defined distance to the LED surface and in a region having defined shape. Therefore, no Fresnel back reflections occur, which are absorbed on the component surfaces, there is no total internal reflection, which reflects back the yellower-colored light of white LEDs at high emission angles and thus would result in a blue color shift of the module. Furthermore, in comparison to homogeneous volume scattering means, substantially higher decoupling efficiencies are achieved with comparable homogeneity and module geometry. In addition, the geometric shape of the scattering layer is exactly defined by the geometric embodiment of the U-profile and the filling quantity of the transparent layer. A thickness reduction of the scattering layer toward the module edge enables a more homogeneous appearance of the module from different viewing angles. In addition, no special surface treatments are required due to the production method according to various embodiments, in order to achieve sufficient adhesion of the scattering layer on the transparent layer, and color variations along a linear module due to local delamination having different delamination distances between the transparent layer and scattering layer can be avoided, which may only be avoided in other production methods with a very high expenditure, for example, by targeted plasma surface pretreatments. Furthermore, there are no problems because of material incompatibilities of the transparent layer and scattering layer, such as delamination, corrosion, degradation, and yellowing, and the production can be implemented very simply and cost-effectively using standard dispensing processes.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:
1. A method for producing an LED module comprising:
   providing a housing, which is implemented as a hollow body, which has an opening on a light exit side of the LED module, wherein the housing has a base side, which is arranged opposite to the light exit side;

arranging a circuit board having at least one LED on the base side of the housing;

pouring a second base layer made of a curable material in a non-cured state into the housing;

curing the second base layer; then, thereafter, pouring in at least one first base layer made of a curable material in a non-cured state through the opening into the housing onto the cured second base layer; and pouring in a scattering layer made of a curable material in a non-cured state through the opening into the housing;

wherein the scattering layer is poured in onto the first base layer, wherein the first base layer is not cured during the pouring in of the scattering layer, and after the pouring in of the scattering layer, the at least one first base layer and the scattering layer are cured.

2. The method as claimed in claim 1,
wherein during the pouring in of the first base layer, a sufficient amount of curable material is poured in that a surface of the poured-in base layer assumes a curvature pre-definable by a filling quantity.

3. The method as claimed in claim 1,
wherein, during the providing of the housing, a notch, which extends at a distance to the base side of the housing, is at least regionally introduced in a delimitation side of the housing, which is arranged on the base side and extends from the base side up to the light exit side of the LED module, wherein the base side and the delimitation side define the hollow body having the opening.

4. The method as claimed in claim 1,
wherein a material is used for the scattering layer, which comprises a base material having scattering particles, wherein the base material has the same properties as those of the first base layer, so that a phase boundary does not form during the curing of the first base layer and the scattering layer.

5. The method as claimed in claim 1,
wherein the LED has a light exit side, which defines an upper edge of the LED, and the at least one first base layer is poured in such that a surface of the first base layer opposite to the base side of the housing after the pouring in has a distance to the light exit side of the LED module which is less than a distance of the upper edge of the LED from the light exit side of the LED module.

6. The method as claimed in claim 5,
wherein the second base layer is poured in at most up to the upper edge of the LED.

7. The method as claimed in claim 1, wherein the second base layer contains a white pigmentation wherein the white pigmentation reflects back-reflected light.

8. The method as claimed in claim 1, further comprising fixing the at least one LED arranged on the circuit board by an adhesive onto the base side of the housing.

9. The method as claimed in claim 8, wherein the adhesive is dispensed in a defined layer thickness into the housing.

10. The method as claimed in claim 1, further comprising linearly arranging a plurality of LEDs on the circuit board.

11. The method of claim 1, further comprising forming the second base layer from a transparent matrix material.

12. The method of claim 8, further comprising curing the adhesive such that no bubbles are formed in the adhesive.

13. The method of claim 1, further comprising pouring the second base layer up to, at most, an upper edge of the LED.

14. The method of claim 11, further comprising including a reflective pigmentation in the second base layer.

15. The method of claim 1, further comprising arranging the second base layer, the first base layer and the scattering layer such that the LED is enclosed, and contacting a delimitation side of the housing, which is arranged on the base side and extends from the base side up to the light exit side of the LED module, wherein the base side and the delimitation side define the hollow body having an opening.

16. The method of claim 2, further comprising pouring the first base layer up to an upper edge of the housing such that an outwardly bulging, convex shape of the surface of the poured-in base layer is formed.

17. The method of claim 1, wherein the second base layer reflects a back-reflected light.

18. The method of claim 2, wherein the sufficient amount of curable material is poured such that the thickness of the scattering layer having a smaller distance to a delimitation side of the housing is less than the thickness of the scattering layer having a greater distance to the delimitation side of the housing, wherein the delimitation side of the housing is arranged on the base side and extends from the base side up to the light exit side of the LED module.

19. The method of claim 1, further comprising arranging the first base layer and the scattering layer such that they share a virtual intermediate surface.

* * * * *